United States Patent [19]

Conrad et al.

[11] Patent Number: 4,707,563

[45] Date of Patent: Nov. 17, 1987

[54] COMPONENT HOUSING FOR ELECTRICAL AND ELECTRONIC CIRCUITS

[75] Inventors: Horst Conrad; Konrad Tobergte; Rainer Schulze, all of Detmold, Fed. Rep. of Germany

[73] Assignee: C. A. Weidmüller GmbH & Co., Detmold, Fed. Rep. of Germany

[21] Appl. No.: 922,153

[22] Filed: Oct. 23, 1986

[30] Foreign Application Priority Data

Nov. 8, 1985 [EP] European Pat. Off. ........ 85114260.4

[51] Int. Cl.⁴ ............................................. H05K 5/00
[52] U.S. Cl. ...................................... 174/50; 439/716; 439/718
[58] Field of Search .............. 174/50, 138 F; 361/376; 439/693, 712, 715, 716, 718, 892

[56] References Cited

U.S. PATENT DOCUMENTS 3,766,515 10/1973 Debaigt ................................ 439/716
3,992,074 11/1976 Rymer .................................. 439/716

Primary Examiner—Arthur T. Grimley
Assistant Examiner—David A. Tone
Attorney, Agent, or Firm—Erwin S. Teltscher

[57] ABSTRACT

A component housing for electrical and electronic circuits and components includes a frame constituting respective narrow sides of the housing at least one of which has a plurality of openings having different configurations in conformity with various connecting techniques to be used. Two lateral covering plates are arrestingly connected to the frame. A contact protection housing portion of an electrically insulating material extends over at least a partial region of the one narrow side of the frame and bounds a receiving space at the region of the one narrow side of the frame, especially for contact protected accommodation of lug-shaped connectors which extend upwardly beyond the one narrow side of the component housing. The contact protection housing portion has apertures that give access to those of the openings which are provided in the region of the one narrow side of the frame and is held in position by the lateral covering plates.

12 Claims, 4 Drawing Figures

COMPONENT HOUSING FOR ELECTRICAL AND ELECTRONIC CIRCUITS

BACKGROUND OF THE INVENTION

The present invention relates to housings in general, and more particularly to component housings for electrical and electronic circuits and components.

There are already known various constructions of component housings for electronic circuits and components, among them such which basically consist of a frame which constitutes respective narrow sides of the component housing, and of two lateral covering plates which close the open sides of the frame and are arrestingly connected to the frame. The frame is usually provided at least in one of the narrow sides with a plurality of openings for the selective passage therethrough of various elements employed in accordance with diverse connecting techniques for the components and electrical circuits accommodated in the interior of the component housing. These openings may include, for instance, circular holes which provide for access to clamping screws of clamping yoke connecting arrangements situated in the interior of the component housing and/or passage slots serving for the passage therethrough of lug-shaped connectors, especially flat plug-in lug connectors and/or soldering lugs, between the interior and the exterior of the component housing, so that such connecting elements then project outwardly beyond the one narrow side of the frame. There may further be provided at least one additional opening for the passage therethrough of an electronic component or module which is at least partially situated at the exterior of the component housing and which is connected in the interior of the component housing, for instance, to a printed circuit board. Such known component housings are often additionally provided or connected at another narrow side thereof which is situated opposite to the one narrow side with an arresting foot, so that they can be arranged in a row on and arrestingly connected with a standardized rail.

With the increasing popularity and widening range of application of the component housings of the above type, even as far as the voltage range of the electrical and electronic components is concerned, there is encountered the problem of contact protection at least for the otherwise exposed lug-shaped connectors projecting outwardly of the component housing through the openings provided therefor in the aforementioned one narrow side of the frame. This potential problem has not yet been fully satisfactorily solved.

SUMMARY OF THE INVENTION

Accordingly, it is a general object of the present invention to avoid the disadvantages of the prior art.

More particularly, it is an object of the present invention to provide a component housing for electrical and electronic components and circuits, which does not possess the drawbacks of the known housings of this type.

Still another object of the present invention is to devise a component housing of the type here under consideration which provides reliable contact protection for elements projecting out of the contact housing.

It is yet another object of the present invention to design the above component housing in such a manner as to maintain the flexibility of the component housing as far as its utilization and application is concerned, and yet to provide the contact protection where needed.

A concomitant object of the present invention is so to construct the component housing of the above type as to be relatively simple in construction, inexpensive to manufacture, easy to use, and yet reliable in operation.

In keeping with these objects and others which will become apparent hereafter, one feature of the present invention resides in a component housing for electrical and electronic circuits and components, which housing comprises a frame constituting respective narrow sides of the housing at least one of which has a plurality of openings having different configurations, and two lateral covering plates which are arrestingly connected to the frame. There is further provided a contact protection housing portion of an electrically insulating material which extends over at least a partial region of the one narrow side of the frame, bounds a contact protected receiving space at the aforementioned region of the one narrow side of the frame, has apertures that give access to those of the openings which are provided in the aforementioned region of the one narrow side of the frame, and is held in position by the lateral covering plates.

It will be appreciated that any projecting lug-shaped connectors which are possibly provided at and project outwardly of the component housing at the aforementioned partial region in correspondence with the utilization purpose and the connection technique used obtain the desired contact protection in the receiving space which is provided in the above-mentioned manner and which extends over at least the partial region of the one narrow side of the component housing, due to the provision of the contact protection housing portion made of an electrically insulating material. At the same time, it is still possible to easily establish electrical connections with these connectors through the small apertures provided in the contact protection housing portion by electrically conductive elements passing through such apertures.

According to an advantageous aspect of the present invention, the contact protection housing portion is separate from the lateral covering plates, and there is further provided means for arrestingly connecting the contact protection housing portion to each of the lateral covering plates. When this expedient is resorted to, the contact protection housing portion is a structural unit separate from the component housing proper. The frame and the lateral covering plates of the component housing then uniformly have identical configurations regardless of the use to which the component housing is to be put, and there are merely being used, in conjunction or combination with such unitary component housings, contact protection housing portions of selected suitable configurations which are fitted to the respective applications, for instance such which extend only over a part of the one narrow side of the frame, in order to protect the lug-shaped connectors which are in this particular application provided on and project outwardly from only this part of the one narrow side of the frame. However, it is also possible and contemplated by the present invention to utilize contact protection housing portions which extend over the entire one narrow side of the frame when the lug-shaped connectors are provided on and extend in a corresponding distribution outwardly of the entire one narrow side of the frame. The last-mentioned expedient has the advantage that a good contact protection is also additionally obtained for electronic components or modules which possibly extend outwardly of the one narrow side of the component housing. As a result of the use of this aspect of the present invention, the overall construction and fabrication of the system remains very simple, inasmuch as it is merely necessary, while utilizing a unitary frame construction and a unitary lateral covering plate construction, to manufacture and stock only the various additional structural units which constitute the various contact protection housing portions upon their assembly with the respective component housings.

On the other hand, it is also possible without encountering any difficulties and proposed by the present invention for the contact protection housing portion to be subdivided into two components each of which is formed on one of the lateral covering plates, and for the two components of the contact protection housing portion to be advantageously arrestingly connected with one another upon assembly of the covering plates with the frame. Even under these circumstances, the fabrication of the overall system remains simple, since a unitary frame can be used and it is merely necessary to produce and store two to three different kinds of the lateral covering plates, namely, lateral covering plates without any contact protection housing portion components formed thereon, as well as lateral covering plates with the contact protection housing portion components formed thereon. The lateral covering plates of the last-mentioned kind may then be formed with the contact protection housing portion components, as the case may be, according to the aforementioned subdivision with the extension of the contact protection only over a part of the one narrow side of the frame or over the entire area of the one narrow side of the frame.

It is further advantageous when the contact protection housing portion includes receiving spaces for identification carriers. The contact protection housing portion advantageously includes at least at a central region thereof respective webs which extend only a small distance toward the one narrow side of the frame. The aforementioned means for arrestingly connecting the contact protection housing portion to each of the lateral covering plates advantageously includes respective strip-shaped arresting portions on respective free end regions of the contact protection housing portion, and arresting grooves provided on the lateral covering plates and each arrestingly receiving one of the strip-shaped arresting portions of the contact protection housing portion.

According to another advantageous facet of the present invention, the lateral covering plates have a predetermined thickness, and the one narrow side of the frame has respective edge portions each of which is recessed substantially by the predetermined thickness with respect to the remainder of the frame. When the contact protection housing portion extends only over a portion of the predetermined length, there is advantageously further provided a reinforcing tongue which is formed integrally with the housing and extends substantially parallel to the one narrow side of the frame over the remainder of the predetermined length. This reinforcing tongue is advantageously formed on at least one of the covering plates.

BRIEF DESCRIPTION OF THE DRAWING

The present invention will be described below in more detail with reference to the accompanying drawing in which.

DETAILED DESCRIPTION OF THE PREFERRED EMBODIMENT

Figure 1:
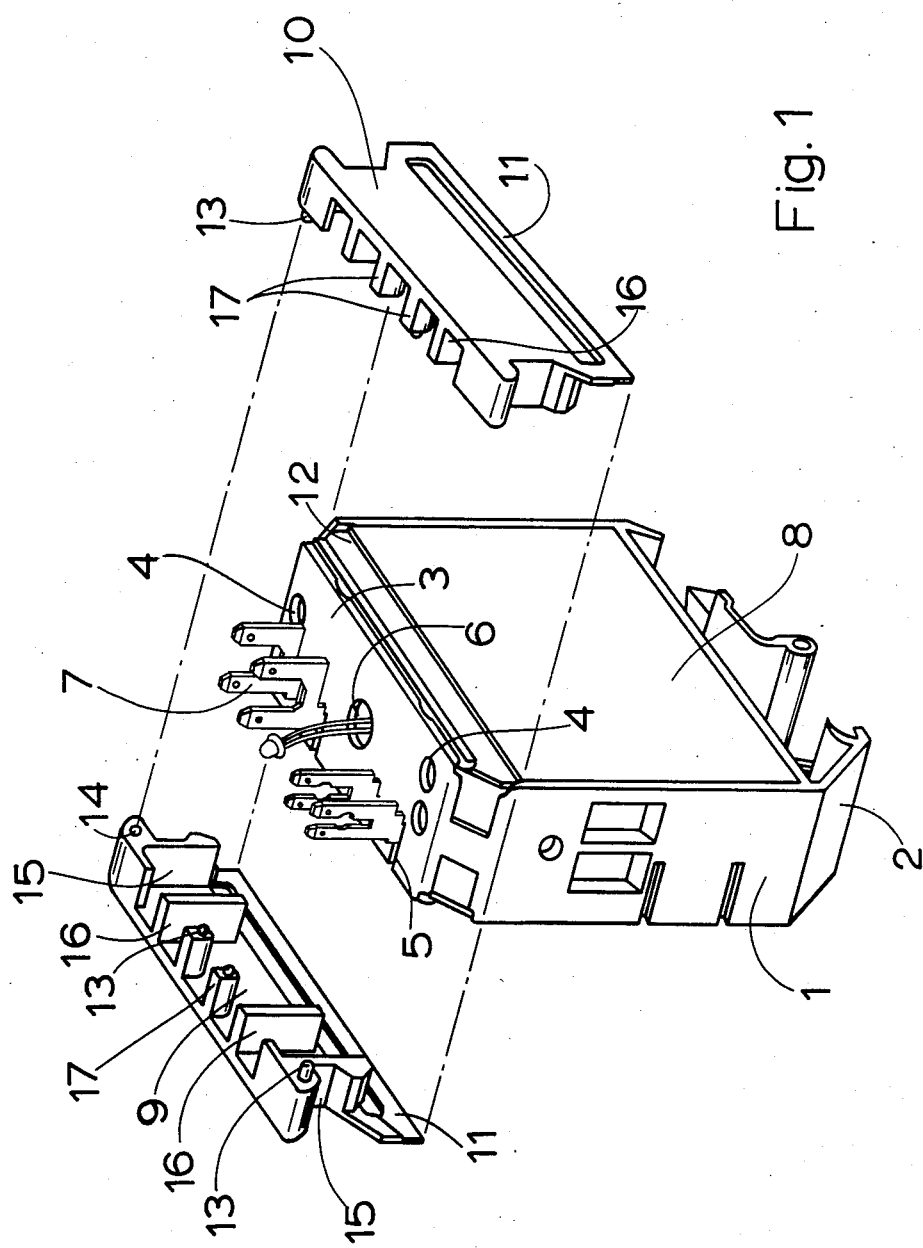
FIG. 1 is an exploded perspective view of a component housing according to the present invention.

Referring now to the drawing in detail, and first to FIG. 1 thereof, it may be seen that the reference numeral 1 has been used therein to identify a frame of a component housing for electronic circuits and modules. The frame 1 forms the narrow sides of the component housing and is provided at its lower region as considered in the drawing with an arresting foot arrangement 2 for the mounting of the component housing on a standardized carrying rail. Diverse different openings for the introduction and exit of conductors, connecting parts and the like are provided in the frame 1 in accordance with the function to be achieved and other considerations. Especially those of such openings which are provided in a narrow upper side 3 of the frame 1 are of interest in the context of the present invention.

In the illustrated construction, the frame 1 is provided, in order to be adaptable to various connecting techniques, both at the front and at the back region of the narrow upper side 3, respectively with openings 4 shaped as circular holes, on the one hand, as well as with lateral through slots 5. The frame 1 is further provided at the central region of its narrow upper side 3 with a further opening 6 which is also configured as a circular hole. The holes 4 serve for providing access to clamping screws of clamping yoke connectors, which are situated in the corresponding internal region of the component housing. As the case may be, lug-shaped connectors 7 such as, for example, flat push-on connectors pass from the interior to the exterior of the frame 1 through the through slots 5. In certain applications of the component housing, electronic components can project to the exterior of the frame 1 through the hole 6; these components are connected in the interior of the component housing, for instance, with a printed circuit board.

The two lateral surfaces of the component housing and of the frame 1 are closed or covered in a known manner by means of lateral covering plates 8. The covering plates 8 carry arresting elements which cooperate with complementary arresting portions provided on the frame 1 to connect the covering plates 8 to the frame 1.

When the housing of the above construction is used only in connection with the clamping yoke technology, there are not encountered any contact protection problems. However, when one or more of the lug-shaped connectors 7, which are to project outwardly or upwardly beyond the narrow upper side 3 of the frame 1, are needed at one or even at both of the end portions of the narrow upper side 3 of the component housing, the component housing construction as described so far does not initially offer any contact protection for such lug-shaped connectors 7.

Now, in accordance with the present invention, there is provided an additional contact protection housing portion made of an electrically insulating material. In the construction depicted in FIG. 1 of the drawing, this contact protection housing portion is constituted by a separate additional element which is connected, in the case of need, with the lateral covering plates 8. In the construction illustrated in FIG. 1, this separate additional component itself is subdivided, so that it consists of individual components 9 and 10. Each of these separate components 9 and 10 is then provided at its lower region with a strip-shaped arresting portion 11 which is elastically yieldable within predetermined limits, and each of the covering plates 8 is provided at its upper region with an arresting groove 12 that accommodates and holds the respective arresting portion 11.

The two components 9 and 10 of the contact protection housing portion are provided, at their sides which face one another, with respective pluralities of arresting pins 13 and associated arresting holes 14 which are so configured and distributed with respect to one another on the respective components 9 and 10 that the respective arresting pin 13 is received in the associated arresting hole 14 and is held therein after assembly of the components 9 and 10 with one another to secure the components 9 and 10 to one another. The two contact protection housing portion components 9 and 10 are further provided at their front and rear regions with respective terminal parts 15 and with various webs 16 and 17 which are arranged at respective distances from each other in such a manner that they form, after the assembly of the components 9 and 10, relatively narrow or small apertures with one another. Then, conductors, cables and the like can pass through such apertures upwardly from the interior to the exterior of the assembled housing without encountering any difficulties while, at the same time, reliable contact protection is obtained for the connectors 7 in their otherwise exposed state. This is so because such connectors 7 are accommodated under these circumstances in the interior of the contact protection housing portion constituted by the components 9 and 10. As may be perceived from FIG. 1 of the drawing, when the webs 17 situated at the central region of the components 9 and 10 of the contact protection housing portion are configured in the illustrated manner, that is, when they do not extend to any significant depth, there can be formed at this central region a relatively voluminous receiving space in which there can then be accommodated, in the case of need, an electronic component or module which projects upwardly and outwardly from the narrow upper side 3 of the component housing 1 and which is also protected from contact and thus from damage by the aforementioned contact protection housing portion.

When this construction is resorted to, the very same type of component housing consisting of the frame 1 and the lateral covering plates 8 is being used in all cases for the diverse applications, while the contact protection housing portion may have different constructions and/or configurations. So, for instance, the contact protection housing portion may have the construction and configuration shown in and described above in conjunction with FIG. 1 of the drawing. However, there may also be be used a truncated version in which the contact protection housing portion, while having basically the same basic construction and configuration as discussed above, extends only over about a half of the length of the narrow upper side 3 of the frame 1. This modified construction is particularly of interest when, in a special application case, clamping yoke technology is employed at one end of the housing while the lug-shaped projecting connectors 7 are employed at the other end of the housing.

In a deviation from the illustrated subdivided contact protection housing portion construction, the contact protection housing portion can also be of one piece, inasmuch as even under these circumstances the arresting portions 11 of such one-piece contact protection housing portion have sufficient flexibility to assure an unproblematical mounting of the contact protection housing portion on the lateral covering plates 8.

Figure 2:
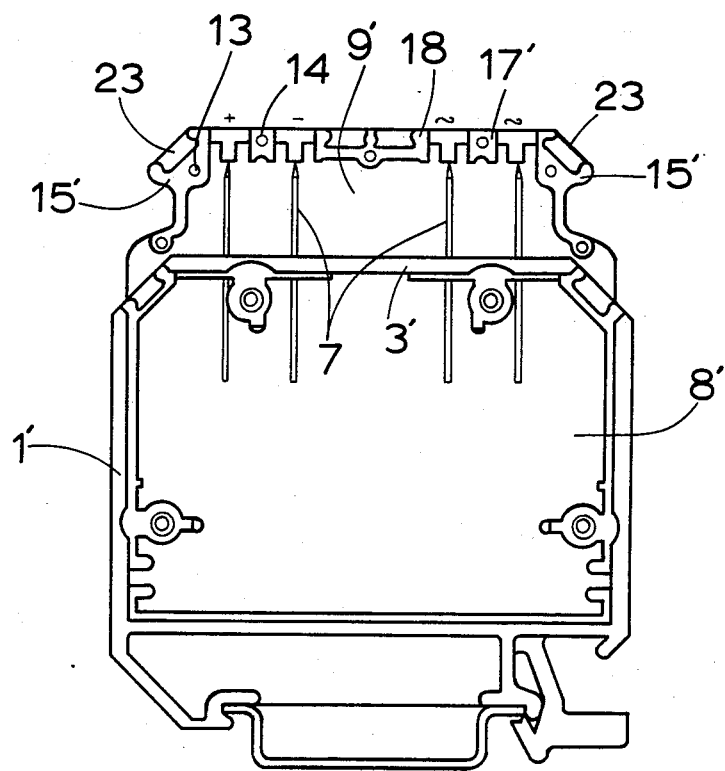
FIG. 2 is a side elevational view of a modified construction of the component housing of the present invention.

In a modified construction of a component housing according to the present invention which is depicted in FIG. 2 of the drawing where the same reference numerals as before but supplemented with single primes to indicate modifications have been used to identify corresponding parts, the subdivided contact protection housing portion is formed in such a manner that respective components of the subdivided contact protection housing portion, such as the component 9' shown in FIG. 2, are provided as integral portions of the respective lateral covering plates 8'. Then when the lateral covering plates 8' are assembled and arrestingly connected in the usual manner with the frame 1' of the component housing, the two components of the contact protection housing portion are automatically joined to the contact protection housing portion over the narrow upper side 3' of the frame 1' of the component housing.

In order to assure secure holding together of the contact protection housing portion even under these particular circumstances, the contact protection housing portion components are advantageously again arrestingly connected with one another. To this end, the component 9' illustrated in FIG. 2 of the drawing is again provided, for example, in part with the arresting pins 13 and in part with the arresting holes 14, while the other contact protection housing portion that is not shown in FIG. 2 is provided with the corresponding complementary arresting holes 14 and arresting pins 13 at the corresponding locations. In the construction illustrated in FIG. 2 of the drawing, the contact protection housing portion extends substantially over the entire length or depth of the component housing. There are again provided respective front and rear terminal parts 15' and webs 17', as well as additional webs 18, which have various sizes and which are arranged at respective spacings from each other so as to form in the upper side of the contact protection housing portion respective apertures through which conductors, cables and the like can pass. Herein, the illustration of FIG. 2 also shows the contact-protected arrangement of the portions of the lug-shaped connectors 7 which project upwardly beyond the narrow upper side 3' of the frame 1'.

Figure 3:
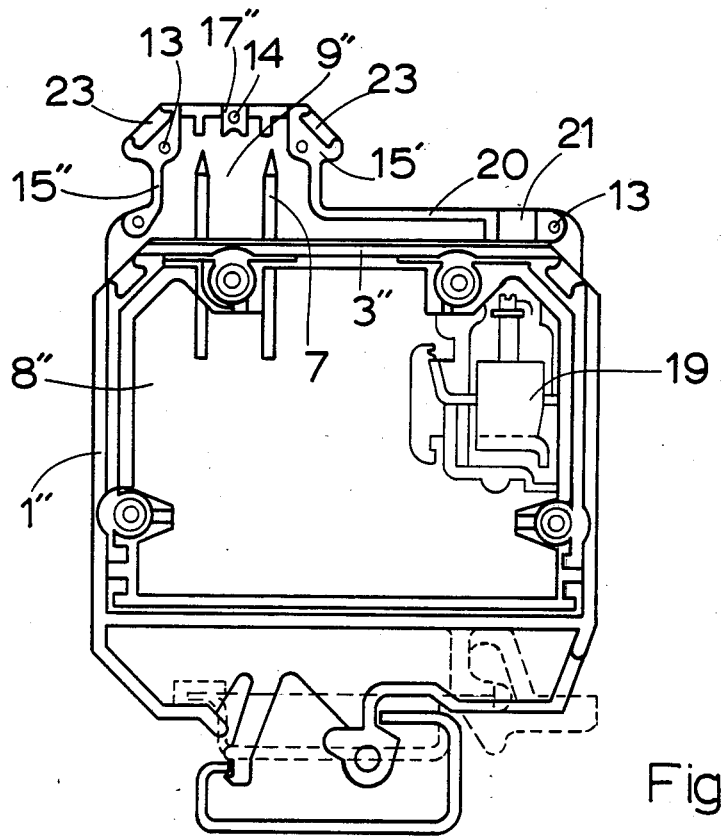
FIG. 3 is a view similar to FIG. 2 but showing a further modification of the component housing.
Figure 4:
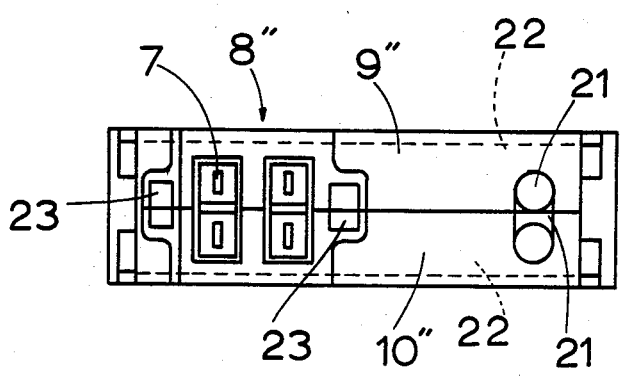
FIG. 4 is a top plan view of the component housing of FIG. 3.

In a further modification of the component housing construction which is illustrated in FIGS. 3 and 4 of the drawing in which the same reference numerals as before but supplemented with double primes to indicate modifications have been used to identify corresponding parts, the contact protection housing portion again has a subdivided or split construction and the respective components 9" and 10" thereof are formed on the respective lateral covering plates 8". In contradistinction to the construction illustrated in FIG. 2 of the drawing, the contact protection housing portion proper extends in the construction of FIGS. 3 and 4 only over over a portion of the length or depth of the narrow upper side 3" of the frame 1" of the component housing. Thus, what is involved here is an application in which circuits or modules which are provided with the upwardly projecting lug-shaped connectors 7 are provided only at the front or at the rear region of the component housing while components or modules which operate in accordance with the clamping yoke technology are arranged at the remaining region of the component housing which is not covered by the contact protection housing portion. One such component 19 employing the clamping yoke technology is indicated in FIG. 3 in light solid lines to represent this type of component. The details of the construction of the component 19 and of similar clamping yoke components are well known and not required for understanding the present invention, so that they need not be discussed here.

The two contact protection housing portion components 9" and 10" which are shown in FIG. 4, which together form the contact protection housing portion after the arresting mounting of the lateral covering plates 8" on the frame 1", and which advantageously are again arrestingly connected to one another by means of the arresting pins 13 and arresting holes 14, are again provided at their front and rear regions with wall portions 15" which again define, together with a web 17", the small or narrow apertures through which the conductors or cables leading to the connectors 7 can pass and which are especially well visible in FIG. 4 of the drawing.

For reasons of stability, a reinforcing tongue 20 is further advantageously provided at the upper region of each of the lateral covering plates 8" next to the respective contact protection housing component 9" or 10". The reinforcing tongue 20 extends over the remainder of the narrow upper side 3" of the frame 1" of the component housing and offers an additional connecting or arresting possibility at its end region which is remote from the respective contact protection housing portion component 9" or 10". The reinforcing tongue 20 is provided with a through aperture or opening 21 at that region thereof at which the through holes 4 for a screwdriver are provided in the narrow upper side 3" of the frame 1" of the component housing so that, despite the provision of this reinforcing tongue 20, the clamping screws of the clamping yoke elements or components 19 remain accessible from above.

In the constructions depicted in FIGS. 2, 3 and 4, a provision is made for respective lateral edge portions 22 (see FIG. 4) of the narrow upper side 3' or 3" of the frame 1' or 1" to be recessed with respect to the width of the remainder of the frame 1' or 1" by the thickness of the respective lateral covering plates 8' or 8", so that the lateral covering plates 8' or 8" can be guided under these circumstances upwardly over the narrow upper side 3' or 3" of the frame 1' or 1" in a continuous smooth-walled manner, which renders it possible to arrange the component housing of this construction and configuration in a smooth-walled manner on the standardized rail in a row with other component housings of the same or similar configuration, without widening the component housing as considered in the direction of the row.

In accordance with a further advantageous modification of the component housing which is indicated in FIGS. 2, 3 and 4 of the drawing, the contact protection housing portion components 9', 9" and/or 10" may be further provided, especially at the upper edge regions of their wall portions 15' or 15", with additional receiving recesses 23 for identification carriers, so that these contact protection housing portion components 9', 9" and/or 10" can be additionally utilized as marking carriers.

While the present invention has been described and illustrated herein as embodied in several specific constructions of a component housing having a contact protection housing portion, it is not limited to the details of these particular constructions, since various modifications and structural changes are possible and contemplated by the present invention. Thus, the scope of the present invention will be determined exclusively by the appended claims.

What is claimed is:

1. A component housing for electrical and electronic circuits and components, comprising
    a frame constituting respective narrow sides of the housing at least one of which has a plurality of openings having different configurations;
    two lateral covering plates arrestingly connected to said frame; and
    a contact protection housing portion of an electrically insulating material extending over at least a partial region of said one narrow side of said frame, bounding a contact protected receiving space at said region of said one narrow side of said frame, having apertures that give access to those of said openings which are provided in said region of said one narrow side of said frame, and being held in position by said lateral covering plates.

2. The component housing as defined in claim 1, wherein said contact protection housing portion is subdivided into two components each of which is formed on one of said lateral covering plates and which are arrestingly connected with one another upon assembly of said covering plates with said frame.

3. The component housing as defined in claim 1, wherein said contact protection housing portion is separate from said lateral covering plates; and further comprising means for arrestingly connecting said contact protection housing portion to each of said lateral covering plates.

4. The component housing as defined in claim 3, wherein said contact protection housing portion is subdivided into two components; and further comprising additional means for arrestingly connecting said two components of said contact protection housing portion to each other.

5. The component housing as defined in claim 1, wherein said one narrow side of said frame is elongated and has a predetermined length; and wherein said contact protection housing portion extends over substantially the entire predetermined length of said one narrow side of said frame.

6. The component housing as defined in claim 1, wherein said contact protection housing portion includes respective front and rear web-shaped terminal portions and respective webs situated between said terminal portions and spaced from each other and from said terminal portions to bound said apertures.

7. The component housing as defined in claim 1, wherein said contact protection housing portion includes receiving spaces for identification carriers.

8. The component housing as defined in claim 1, wherein said one narrow side of said frame is elongated and has a predetermined length; and wherein said contact protection housing portion extends over substantially the entire predetermined length of said one narrow side of said frame and includes at least at a central region thereof respective webs which extend only a small distance toward said one narrow side of said frame.

9. The component housing as defined in claim 1, wherein said contact protection housing portion is separate from said lateral covering plates; and further comprising means for arrestingly connecting said contact protection housing portion to each of said lateral covering plates, including respective strip-shaped arresting portions on respective free end regions of said contact protection housing portion and arresting grooves provided on said lateral covering plates and each arrestingly receiving one of said strip-shaped arresting portions of said contact protection housing portion.

10. The component housing as defined in claim 1, wherein said lateral covering plates have a predetermined thickness; and wherein said one narrow side of said frame has respective edge portions each of which is recessed substantially by said predetermined thickness with respect to the remainder of said frame.

11. The component housing as defined in claim 1, wherein said one narrow side of said frame is elongated and has a predetermined length; wherein said contact protection housing portion extends only over a portion of said predetermined length; and further comprising a reinforcing tongue which is formed integrally with the housing and extends substantially parallel to said one narrow side of said frame over the remainder of said predetermined length.

12. The component housing as defined in claim 11, wherein said reinforcing tongue is formed on at least one of said covering plates.

* * * * *